US008664077B2

(12) United States Patent
Nair et al.

(10) Patent No.: US 8,664,077 B2
(45) Date of Patent: Mar. 4, 2014

(54) METHOD FOR FORMING SELF-ALIGNED OVERLAY MARK

(75) Inventors: Vinay Nair, Boise, ID (US); David Pratt, Meridian, ID (US); Christopher Hawk, Meridian, ID (US); Richard Housley, Boise, ID (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 3 days.

(21) Appl. No.: 13/372,515

(22) Filed: Feb. 14, 2012

(65) Prior Publication Data

US 2013/0210213 A1 Aug. 15, 2013

(51) Int. Cl.
*H01L 21/76* (2006.01)
(52) U.S. Cl.
USPC .................................. 438/401; 257/E21.039
(58) Field of Classification Search
USPC ................ 438/401, 424, 717; 257/E21.039
See application file for complete search history.

(56) References Cited

U.S. PATENT DOCUMENTS

| 7,408,265 | B2 * | 8/2008 | Holscher et al. | 257/797 |
| 2004/0185637 | A1 * | 9/2004 | Fu et al. | 438/401 |
| 2005/0236721 | A1 * | 10/2005 | Yen et al. | 257/797 |
| 2006/0223271 | A1 * | 10/2006 | Hara et al. | 438/294 |
| 2007/0049035 | A1 * | 3/2007 | Tran | 438/696 |
| 2011/0287630 | A1 * | 11/2011 | Brown et al. | 438/689 |

FOREIGN PATENT DOCUMENTS

JP 54054579 A * 4/1979

* cited by examiner

*Primary Examiner* — Calvin Choi
(74) *Attorney, Agent, or Firm* — Winston Hsu; Scott Margo (57) ABSTRACT

A method for forming a self-aligned overlay mark is disclosed. First, a first region, a second region and a main feature which is disposed between the first region and the second region all disposed on the substrate are provided. The first region defines a first edge and the second region defines a second edge. Second, a cut mask layer is formed to respectively cover the first region and the second region to expose the main feature. Next, the cut mask layer is determined if it is self-aligned with the second edge or the first edge, and creates a self-aligned overlay mark. Later, a main feature etching step is carried out to transfer the main feature into the substrate when the cut mask layer is determined to be self-aligned with the second edge or the first edge.

19 Claims, 12 Drawing Sheets

METHOD FOR FORMING SELF-ALIGNED OVERLAY MARK

BACKGROUND OF THE INVENTION

1. Field of the Invention

The present invention generally relates to a method for forming a self-aligned mask with respect to a previously formed critical feature on a substrate. In particular, the present invention is directed to a method for forming a non-critical mask layer with respect to a previously formed critical feature and determining if the non-critical mask layer is self-aligned with the previously formed critical feature to serve as a self-aligned overlay mark at the same time.

2. Description of the Prior Art

Fabrication of silicon based memory chips usually involves multiple photolithographic processing steps. In each of these steps, a particular pattern with certain fixed dimensions is printed on the wafer. After all of the particular patterns are processed, a complete working circuit is created. It is very critical that each particular pattern is overlaid on top of a prior reference particular pattern within a certain tolerance, so that the electronic circuit functions. The magnitude of this tolerance is referred to as an overlay specification.

A registration box is used to measure the overlay between one layer and another. The registration box usually has 2 components for an overlay measurement: an example would be a printed outer box locating a prior reference layer, and a printed inner box locating the current layer. The overlay measurement is made by measuring the distance between the inner box and outer box in both the Y direction and the X direction. This distance is then compared to an ideal reference, so the layer to layer overlay is calculated.

As mentioned before, a registration box measures how well one layer is overlaid on top of the other. The purpose of each measurement is to make sure that the overlay specification is met.

In most cases, there are regions of different features on a substrate. For example, on a substrate there may be an array region with denser array features and a peripheral region with less dense peripheral features. Hence, the array features and the peripheral features are different in nature. In particular, the array features are generally smaller than the peripheral features in dimension. For instance electrical devices in the periphery region can be larger in size than the electrical devices in the array region.

Moreover, while the peripheral features can be formed by the ordinary photolithographic techniques since they have larger dimension, the array features instead usually have to be formed using the pitch multiplication techniques. It is challenging to keep each different feature from interfering with one another in the manufacturing process.

After the array features are formed using the pitch doubling process on the substrate, there are parts of the substrate, such as the peripheral region, which need to be protected by a mask. However, the previous resist was striped off after a previous etching step. There are also certain unwanted features formed during the pitch doubling process. These features need to be removed or at least masked off.

In a process where a mask pattern is required to be formed in close proximity to the array features, the problem arises of how to measure the location of critical features such as the array features formed of a denser line/space patterns without the measurement being impacted by the adjacent non-critical pattern of the mask.

Accordingly, there is a need for methods of forming a mask on a substrate which creates a self-aligned overlay mark without jeopardizing the alignment precision of a previously formed critical feature, especially in conjunction with the pitch multiplication techniques.

SUMMARY OF THE INVENTION

In view of the above, the present invention proposes a method for forming a mask on a substrate to create a self-aligned overlay mark without jeopardizing the alignment precision of a previously formed feature. In other words, the present invention proposes a method to solve the problem of how to measure the location of features formed by a critical line/space array without the measurement being impacted by a non-critical feature of a later formed mask.

The present invention proposes a method for forming a self-aligned overlay mark. First, a first region disposed on a substrate, a second region disposed on the substrate and a main feature disposed between the first region and the second region and on the substrate are provided. The first region defines a first edge and the second region defines a second edge. Second, a cut mask layer is formed to respectively cover the first region and the second region. The cut mask layer exposes the main feature at the same time. Next, it is determined if the cut mask layer is self-aligned with the second edge. Later, a main feature etching step is carried out to transfer the main feature into the substrate when the cut mask layer is determined to be self-aligned with the second edge.

In one embodiment of the present invention, the main feature is formed by a pitch-doubling technique.

In another embodiment of the present invention, the main feature has a main feature pattern denser than at least one of the first region and the second region so that the cut mask layer is able to outline as well as frame the main feature pattern.

In another embodiment of the present invention, the main feature has a line/space array pattern and there are a plurality of non-continuous lines in the line/space array pattern. In particular, the edge of the cut mask layer lands on one of the non-continuous lines rather than in a space in the line/space array pattern.

In another embodiment of the present invention, the edge of the cut mask layer is tapered when the cut mask layer is self-aligned with the first edge or the second edge.

In another embodiment of the present invention, the main feature includes a first part and a second part.

In another embodiment of the present invention, the cut mask layer helps form a registration measurement box when the cut mask self-aligns to the first edge and to the edge of the registration measurement box.

In another embodiment of the present invention, the cut mask layer helps form a measurement ring to be detected by a measurement tool in order to determine the position of the main feature.

In another embodiment of the present invention, the cut mask which covers the first region and the second region is removed after the step of etching the main feature.

In another embodiment of the present invention, the cut mask layer is self-aligned with an underlying pattern regardless an X-direction offset or a Y-direction offset of the cut mask with respect to the main feature.

These and other objectives of the present invention will no doubt become obvious to those of ordinary skill in the art after reading the following detailed description of the preferred embodiment that is illustrated in the various figures and drawings.

DETAILED DESCRIPTION

One aspect of the present invention provides a method for forming a protective mask on a substrate to create a self-aligned overlay mark without jeopardizing the alignment precision of a previously formed feature. In another aspect, the present invention also proposes a method to solve the problem of how to measure the location of features formed of a critical pattern without the measurement being impacted by another non-critical feature of a later formed mask.

Figure 1:
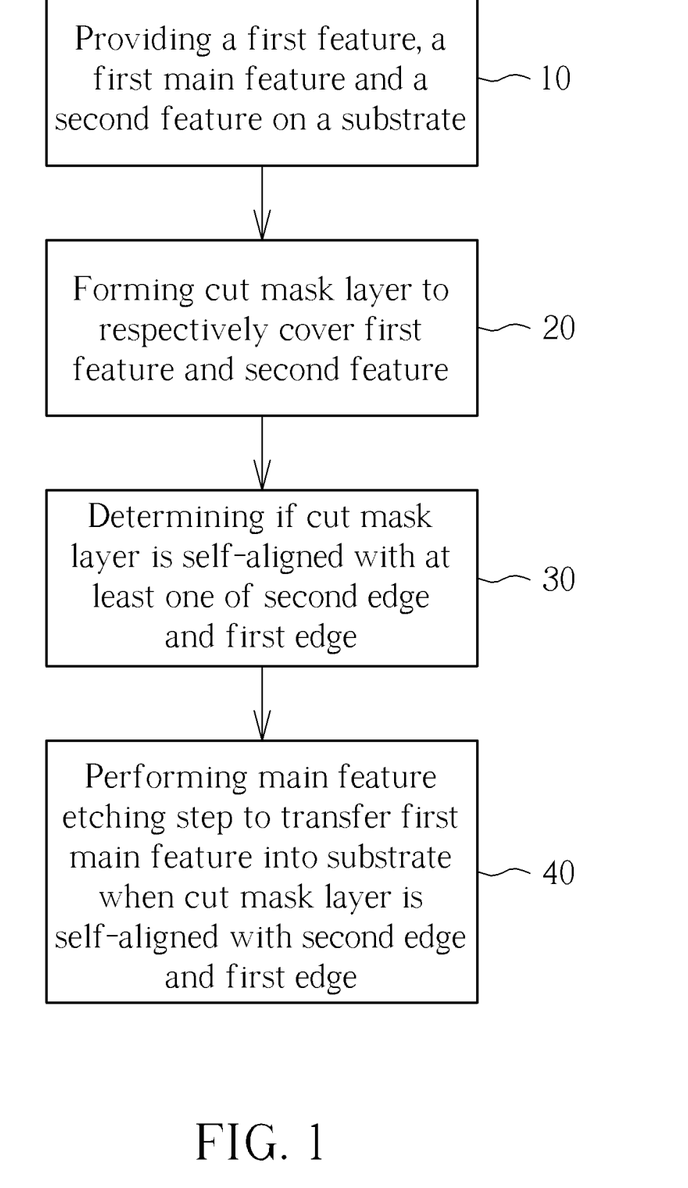
FIG. 1 illustrates the method for forming a self-aligned overlay mark of the present invention.
Figure 5A:
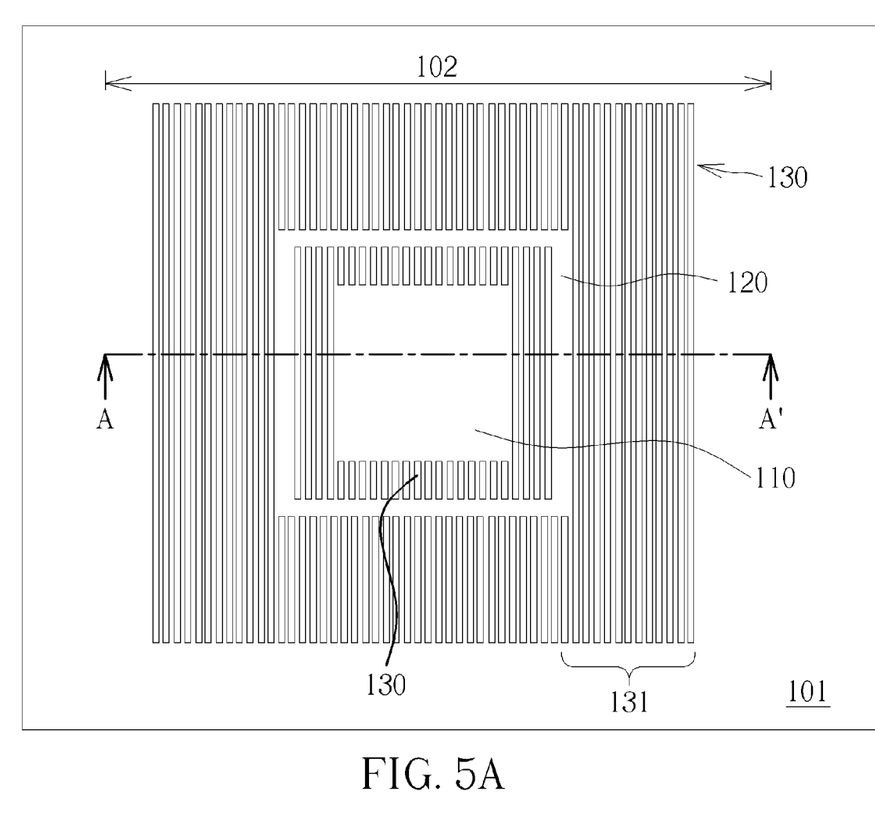
FIG. 5A illustrates a top view of the substrate with the first feature, the second feature and the first main feature.
Figure 5B:
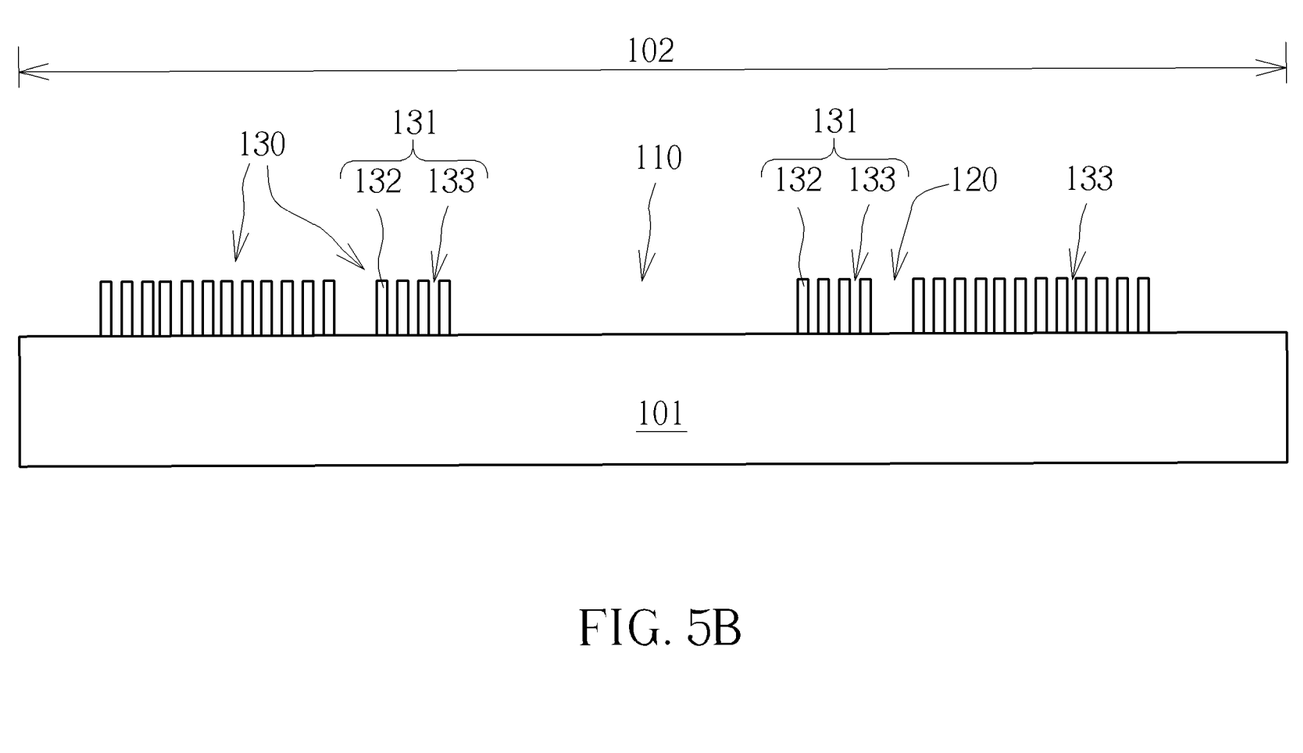
FIG. 5B illustrates a cross sectional view along the line A-A' of FIG. 5A.

FIG. 1 illustrates the method for forming a self-aligned overlay mark of the present invention. As shown in FIG. 5A, first a substrate 101 is provided (step 10). There are certain regions and features disposed on the substrate 101. For example, there are a first region 110, a second region 120, and a main feature 130 including a line/space array pattern 131 disposed on the substrate 101, as shown in FIG. 1. FIG. 5A illustrates a top view of the substrate 101 with the first region 110, the second region 120, the main feature 130 and the line/space array pattern 131. FIG. 5B illustrates a cross sectional view along the line A-A' of FIG. 5A of the substrate 101 with the first region 110, the second region 120, the main feature 130 and the line/space array pattern 131. The main feature 130 and the line/space array pattern 131 may be together disposed in a scribe line region 102 on the substrate 101.

The pitch-doubling techniques may have the following operational steps.

A resist is patterned at a first photolithographic step. The pitch of this pattern is TWICE the required pitch.

B) After some resist trimming processing, a spacer oxide (also known as a spacer) is deposited on the resist surface.

C) A spacer etching step is carried out to remove some of the spacer oxide from the top of the resist line and the bottom of the resist space so that the spacer etching step removes the oxide from horizontal surfaces but leaves the oxide on vertical surfaces.

D) Then the resist is striped off, leaving behind the vertical spacers at half of the original pitch. The pattern which is defined by the spacers is the pitch doubled pattern.

Figure 2:
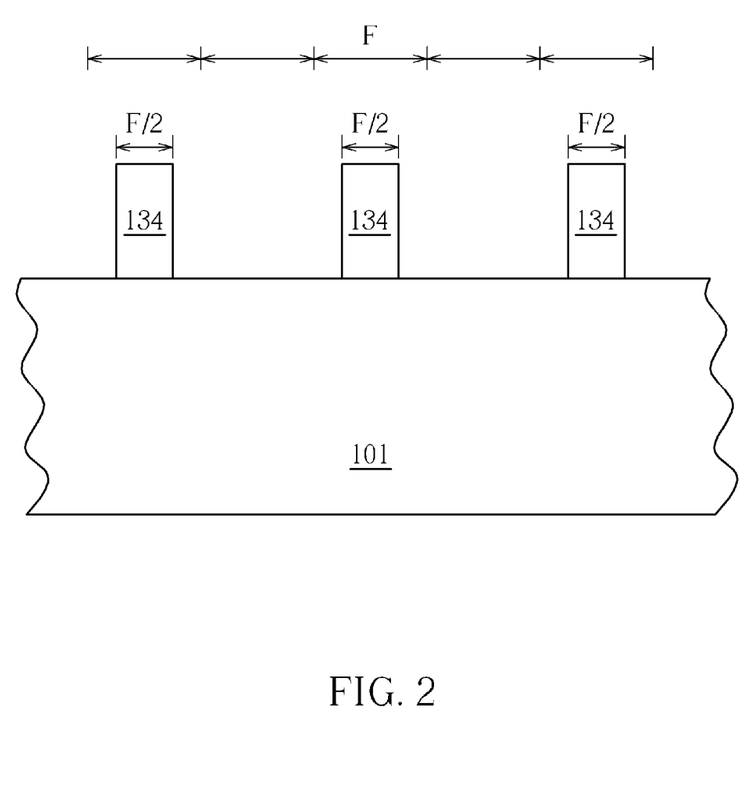
FIGS. 2-4 illustrate the formation of the first main feature.
Figure 3:
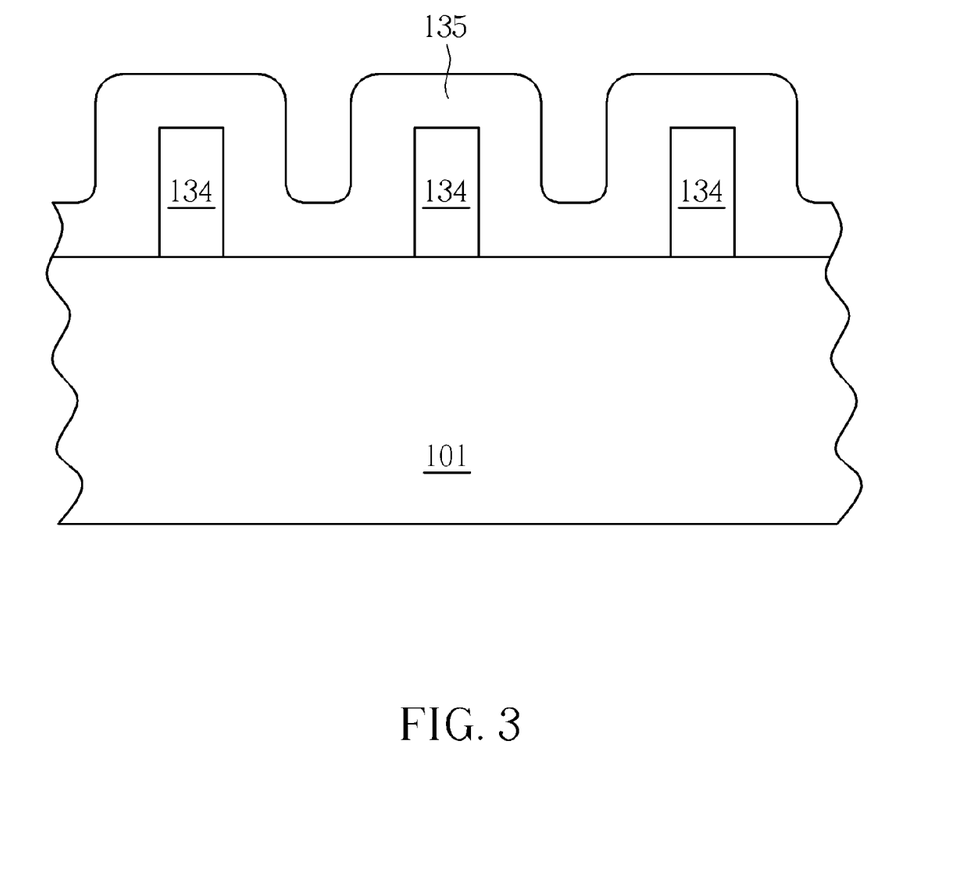
Figure 4:
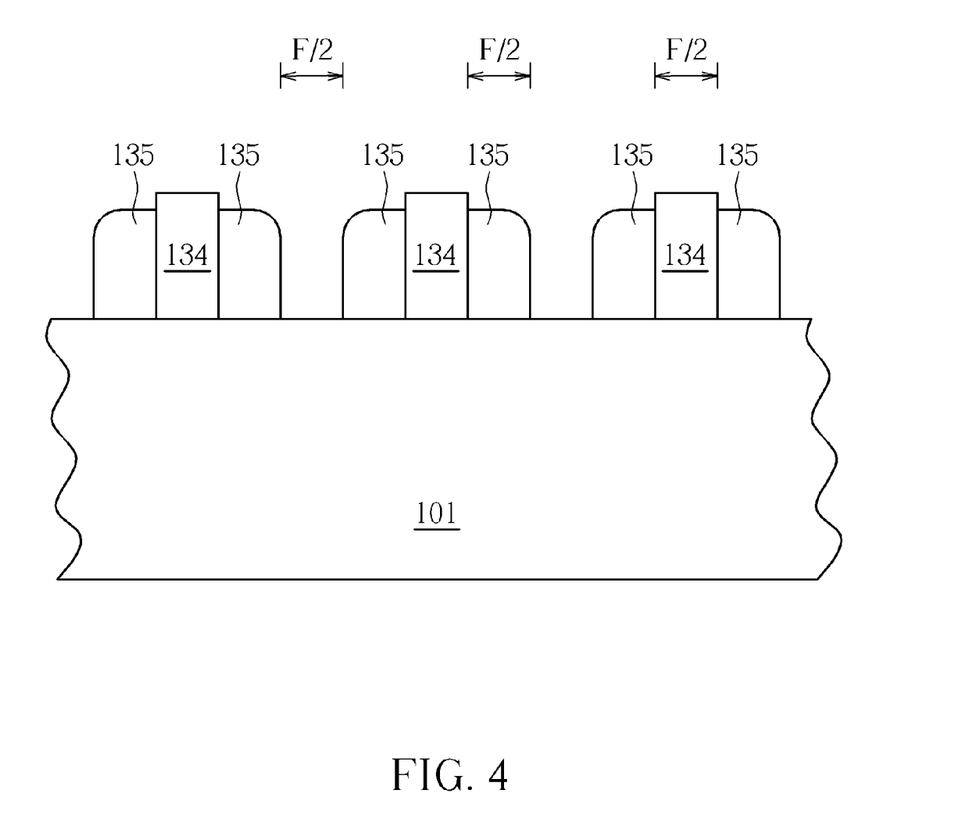

The formation of the main feature 130 may be further explained in accordance with the illustrations of FIGS. 2-4. First, the primary resist lines 134 are formed on the substrate 101. The primary resist lines 134 may be formed by conventional photolithographic procedures so that the primary resist lines 134 are a patterned photoresist and the width as well as the pitch of the primary resist lines 134 are both set to be at a pre-determined value "F," which may be the limitation of the current photolithographic techniques.

Second, the primary resist lines 134 with the width "F" are subjected to a trimming step to reduce the width of the primary resist lines 134. After a proper trimming step, the primary resist lines 134 may have a reduced-width, namely a new width "½F." The results are illustrated in FIG. 2.

Next, as shown in FIG. 3, a main feature layer 135 is conformally deposited over the primary resist lines 134 to cover the primary resist lines 134. The main feature layer 135 may include an oxide. After the main feature layer 135 is partially removed, such as by a spacer etching step, the main feature layer 135 forms a spacer-like structure or a vertical structure attached to each side of the primary resist lines 134. The partial removal of the main feature layer 135 results in a main feature layer 135 with a width of "½F". Also, the space between any two of the adjacent main feature layers 135 is "½F", too. The results are illustrated in FIG. 4.

Later, as shown in FIG. 5B, the primary resist lines 134 are removed to leave the main feature 130 disposed on the substrate 101 alone. The width as well as the pitch of the main feature 130 after the removal of the primary resist lines 134 now are both "½F." In such a way, a new pattern, i.e. the main feature 130, featuring a new dense line/space array 131 including some non-continuous lines 132 and spaces 133 with a pitch half of the original value is established. The main feature 130 serves as a final pitch-doubled product.

After the spacer etching step but before the pattern defined by the main feature 130 is transferred into the substrate 101, some regions, such as the first region 110 or the second region 120, in one aspect should be covered by a photoresist to prevent the specific regions from etching during the following etching step, but the previous resist has already been striped off after the spacer etching step. In another aspect, there are also certain unwanted features formed during the pitch doubling process. These need to be removed or chopped off. The present invention accordingly provides a mask to prevent such specific areas from transferring during the etching step, so that unwanted portions do not influence the formation of features on the substrate.

Figure 6:
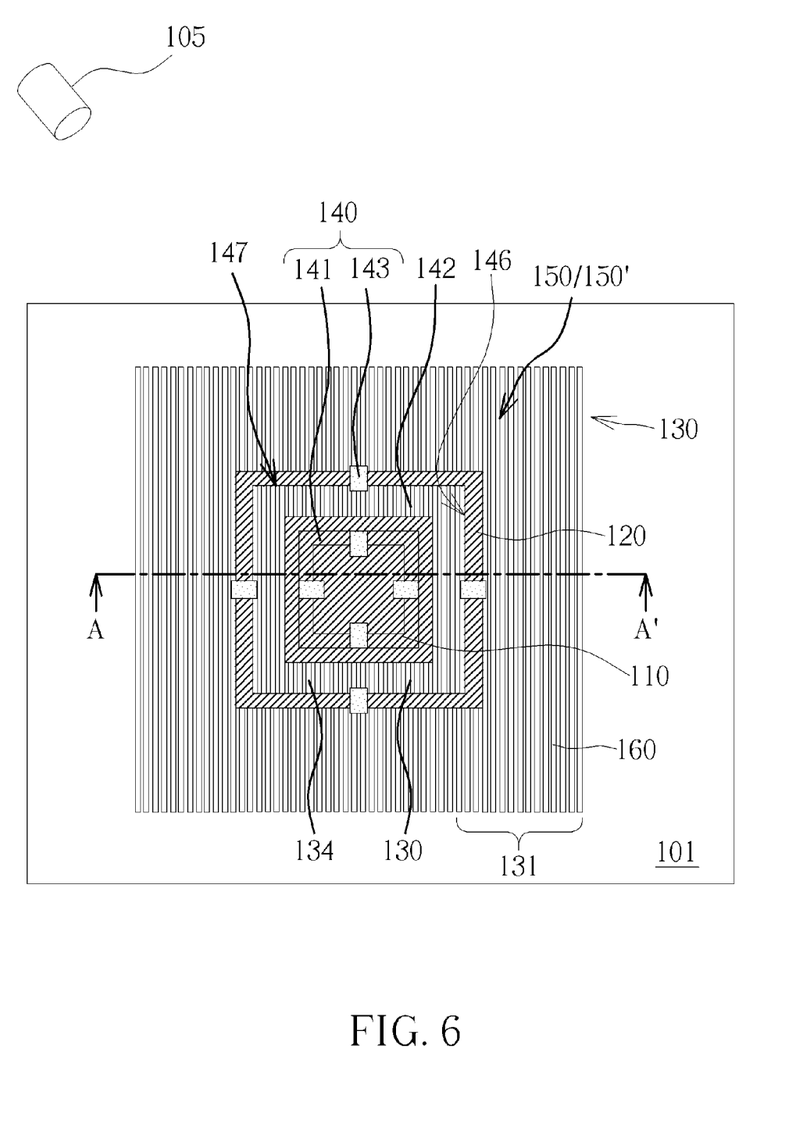
FIG. 6 illustrates the mask disposed on the substrate.
Figure 7:
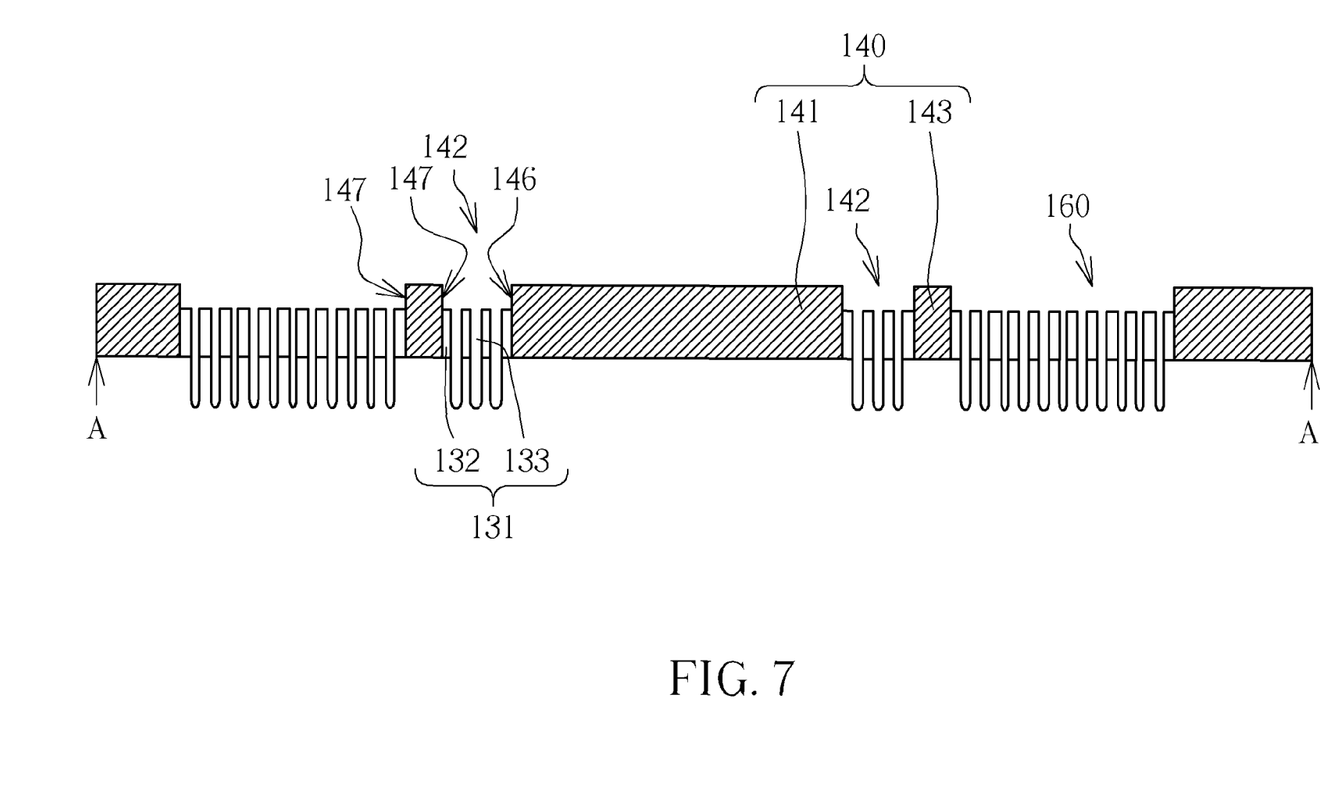
FIG. 7 illustrates the result after the main feature etching step and cut mask exposure.
Figure 8:
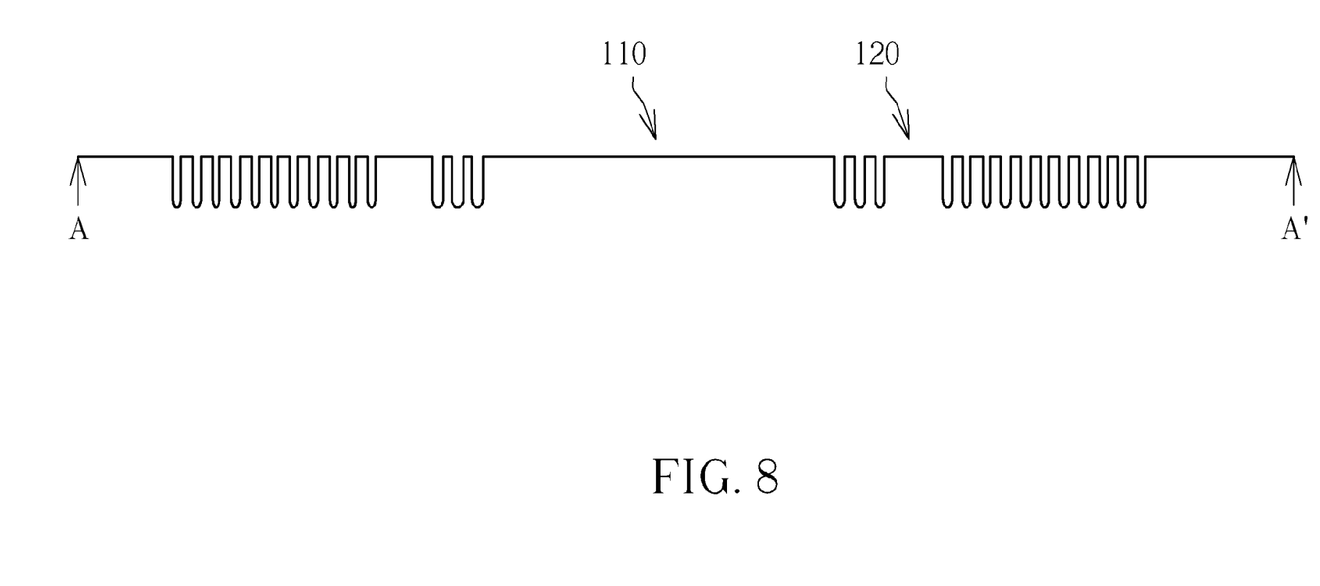
FIG. 8 illustrates the result after the cut mask removed.

Please refer to FIG. 6, which illustrates the mask 140 disposed on the substrate 101 (step 20). The mask 140, i.e. the cut mask layer, is formed on the substrate 101 possibly by photolithographic procedures. The mask 140 may be a photoresist and defines at least three parts, namely a center region 141, an inner open region 142 and a measurement ring 143.

The mask 140 covers the first region 110 to form the center region 141. The center region 141 forms a clean region for a subsequent layer's box. The center region 141, the inner open region 142 and the measurement ring 143 together form a box-in-box overlay mark 150, i.e. a registration box. The measurement ring 143 serves as the outer measurement box of the box-in-box overlay mark 150. And the center region 141 serves as a location for a subsequent layer's registration or overlay box.

The inner open region 142 describes a line/space array 131 which has the features defined by the pitch-doubling techniques and is to be transferred to the substrate 101. Consequently, the inner open region 142 should not be covered by the mask 140.

The line/space array in the inner open region 142 refers to an area of the box-in-box overlay mark 150 which is formed by a dense line/space pattern of features, i.e. the first part 134. This is as opposed to the center region 141 and to the measurement ring 143, which do not have such an array of line/space features. The transitions between array pattern and non-array pattern create a visible contrast which is used as a reference point for the measurements which are taken using the box-in-box structure.

The self-alignment of the mask 140 insures there is no interference on the critical layer 150. By doing this, the subsequent overlay measurement is exclusive to the pitch-double critical layer and not to any other non-critical layer.

In the pitch doubling process, the mask 140 has a looser overlay tolerance, and the mask 140 helps protect regions of the substrate 101 that do not need to be etched. It is important to make sure that the mask 140 does not re-define the edge, i.e. the first edge 146 and the second edge 147 of the pitch doubled pattern. Hence, the mask 140 should self-align to a pitch doubled pattern (the line/space pattern so that the mask 140 does not influence the already defined edges of the critical line/space pattern. Accordingly, the subsequent layers can register back to the critical line/space pattern.

One additional advantage of this invention allows the final pattern to be measured against itself. This means that, without the interaction of another layer, overlay error produced during the manufacturing process of this mask 140 can be measured and quantified. This technique can help greatly when trying to determine where and how overlay error is produced. The point of the invention resides in that any overlay error of the mask 140 will not be detrimental because the mask 140 self-aligns to the critical line/space pattern.

As mentioned, the pitch-multiplying patterns, namely the inner open region 142 and the second main feature 160, have a line/space feature which is more critical than that of the mask 140. The design of the present invention allows for the "critical" pitch-multiplying patterns to be transferred into substrate 101 in the presence of the mask 140 without the potential misalignment of the mask 140 interfering. Since the mask 140 is able to self-align to the pitch doubled pattern, the final etched pitch doubled pattern edges will not be influenced by the mask 140 when this pitch doubled pattern plus the mask 140 finally undergo the etching step.

Figure 9A:
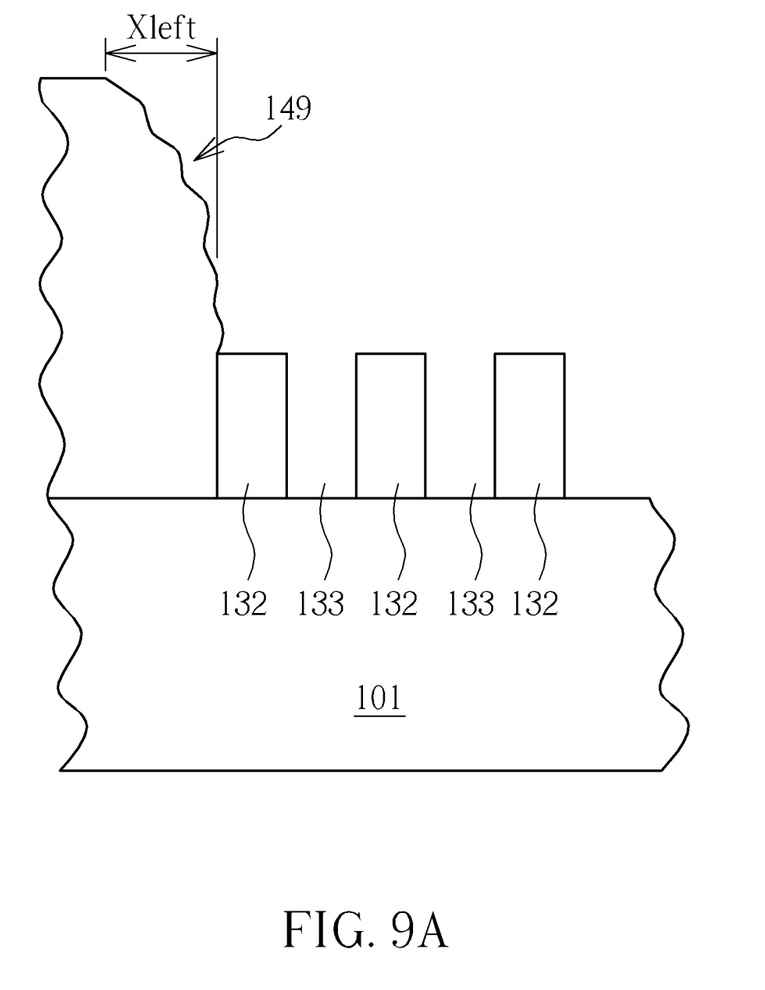
FIGS. 9A and 9B illustrate two situations of the X-direction offset of the mask with respect to the line and the space in the main feature.
Figure 9B:
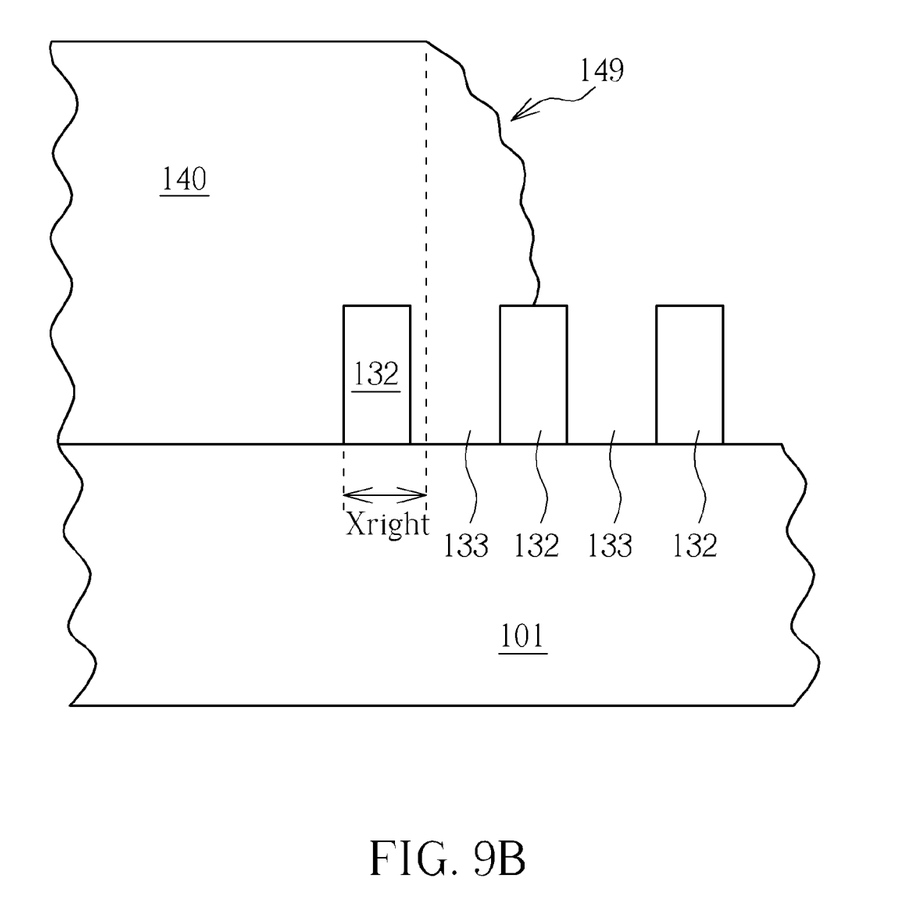

The above result is true only when edge 146 of the measurement ring 143 is in a direction parallel to the main feature 130 of line/space array. There may be an X-direction offset of the mask 140 with respect to the line 132 and the space 133 in the main feature 130 but the mask 140 is still self-aligned with the edge 146. Two demonstrative situations are illustrated in FIGS. 9A and 9B.

Figure 10:
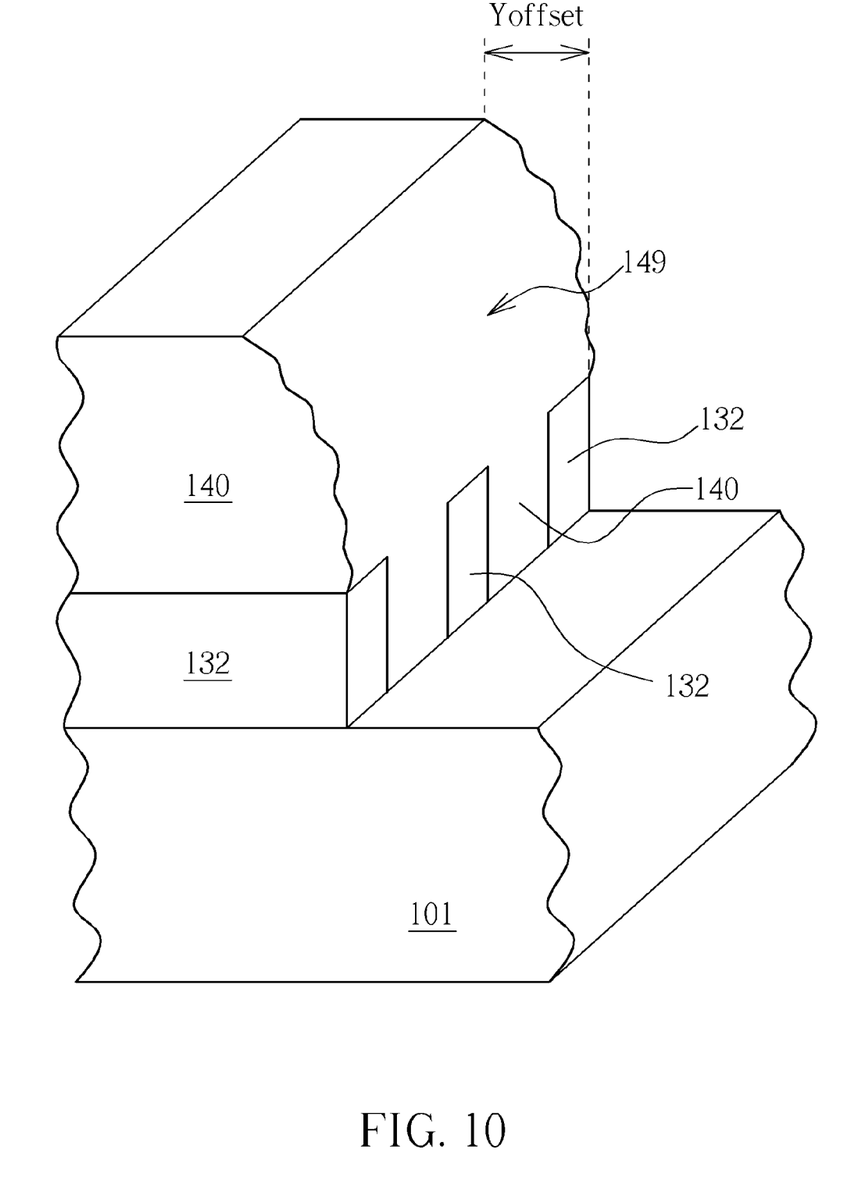
FIG. 10 illustrates an example of the Y-direction offset of the mask with respect to the line ends in the main feature.

On the other hand, since there are many non-continuous line ends in the line/space array, the self-alignment of the mask 140 only occurs where the termination of the lines meets the mask 140. There may be a Y-direction offset of the mask 140 with respect to the line 132 and the space 133 in the main feature 130 but the mask 140 is still self-aligned with the second edge 147. An example is illustrated in FIG. 10.

In other words, the edge of the mask 140 should always land on the line 132 rather than in between the lines. The edges of the mask 140 are supposed to consistently land on a specific and the same line every time, as shown in FIG. 9A or 9B. The mask 140 works to such great degree that the edges of the mask 140 do not fall in any one of the spaces. When the edges of the mask 140 do not line up perfectly with the line/space pattern because of overlay error of mask 140 to line/space pattern, the mask 140 will have a tendency to scum or to stretch towards to land on any closest spacer. This scumming or stretching tendency to the closest spacer may cause a tapered profile, i.e., a tapered edge 149 of the mask 140, as shown in FIGS. 9A, 9B and 10.

Without the benefits of the present invention, subsequent overlay measurements of a layer back to the critical pitch doubled line/space pattern would not be possible. Moreover, the original first edge 146 and second edge 147 would be lost in the following etching step.

Those skilled in the art will readily observe that numerous modifications and alterations of the device and method may be made while retaining the teachings of the invention.

What is claimed is:

1. A method for forming a self-aligned overlay mark, comprising:
    providing a first region and a second region disposed on a substrate and a main feature disposed between said first region and said second region and on said substrate, wherein said first region defines a first edge and said second region defines a second edge;
    forming a cut mask layer to respectively cover said first region and said second region, wherein said cut mask layer exclusively exposes said main feature;
    determining if said cut mask layer is self-aligned with at least one of said second edge and said first edge and creates a self-aligned overlay mark, wherein said main feature has a line/space array pattern and said space in the line/space array pattern is free of said edge of said cut mask layer; and
    performing a main feature etching step to transfer said main feature into said substrate when said cut mask layer is self-aligned with at least one of said second edge and said first edge.

2. The method for forming a self-aligned overlay mark of claim 1, wherein said main feature is formed by a pitch-doubling technique.

3. The method for forming a self-aligned overlay mark of claim 2, wherein said cut mask layer is self-aligned with said second edge only.

4. The method for forming a self-aligned overlay mark of claim 1, wherein said main feature has a main feature pattern denser than at least one of said first region and said second region.

5. The method for forming a self-aligned overlay mark of claim 1, wherein said cut mask layer outlines and frames said main feature pattern.

6. The method for forming a self-aligned overlay mark of claim 1, wherein there is a plurality of non-continuous lines in said line/space array pattern.

7. The method for forming a self-aligned overlay mark of claim 6, wherein the edge of said cut mask layer lands on the closest line of said non-continuous lines.

8. The method for forming a self-aligned overlay mark of claim 6, wherein the edge of said cut mask layer lands on one of said non-continuous lines.

9. The method for forming a self-aligned overlay mark of claim 1, wherein the edge of said cut mask layer is tapered.

10. The method for forming a self-aligned overlay mark of claim 1, wherein said cut mask layer comprises a photoresist.

11. The method for forming a self-aligned overlay mark of claim 1, wherein said cut mask layer is overlaid on top of said main feature.

12. The method for forming a self-aligned overlay mark of claim 1, wherein said main feature comprises a first part and a second part.

13. The method for forming a self-aligned overlay mark of claim 1, wherein said first edge and said second edge remain intact in the presence of said cut mask layer after said main feature etching step.

14. The method for forming a self-aligned overlay mark of claim 1, wherein said cut mask layer helps form a registration measurement box when the cut mask self-aligns to said first edge and to said second edge of the registration measurement box.

15. The method for forming a self-aligned overlay mark of claim 1, wherein said cut mask layer helps form a measurement ring to be detected by a measurement tool to determine the position of said main feature.

16. The method for forming a self-aligned overlay mark of claim 15, wherein one edge of said measurement ring is in a direction parallel to said first main feature.

17. The method for forming a self-aligned overlay mark of claim 1, further comprising:
    removing said cut mask layer from said first region and said second region after said main feature etching step.

18. The method for forming a self-aligned overlay mark of claim 1, wherein said cut mask layer is self-aligned with at least one of said first edge and said second edge regardless an X-direction offset of said cut mask layer with respect to said main feature.

19. The method for forming a self-aligned overlay mark of claim 1, wherein said cut mask layer is self-aligned with at least one of said first edge and said second edge regardless a Y-direction offset of said cut mask layer with respect to said main feature.

* * * * *